(12) United States Patent
America et al.

(10) Patent No.: US 6,489,642 B1
(45) Date of Patent: Dec. 3, 2002

(54) IMAGE SENSOR HAVING IMPROVED SPECTRAL RESPONSE UNIFORMITY

(75) Inventors: William G. America, Kingston, NY (US); Christopher R. Hoople, Rochester, NY (US); Loretta R. Fendrock, Hilton, NY (US); Stephen L. Kosman, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 134 days.

(21) Appl. No.: 09/672,246

(22) Filed: Sep. 28, 2000

(51) Int. Cl.[7] .................. H01L 27/148; H01L 31/00
(52) U.S. Cl. ............. 257/232; 257/233; 257/445; 257/448; 438/75; 438/78; 438/79
(58) Field of Search .................. 257/222, 232, 257/233, 249, 250, 445, 448, 229, 230, 246, 247, 248; 438/75, 78, 79

(56) References Cited

U.S. PATENT DOCUMENTS 5,442,207 A * 8/1995 Jeong .................. 257/220
5,483,090 A * 1/1996 Kitamura et al. ........... 257/223
5,798,542 A   8/1998 Anagnostopoulos et al. ..... 257/332
5,804,845 A * 9/1998 Anagnostopoulos et al. ..... 257/231

* cited by examiner

Primary Examiner—Sara Crane
Assistant Examiner—Donghee Kang
(74) Attorney, Agent, or Firm—Peyton C. Watkins

(57) ABSTRACT

An image sensor, includes a semiconductor substrate; a photosensor having, a first photosensing region including a first stack of one or more layers of transparent materials overlying the substrate, the first photosensing region having a spectral response having peaks and valleys, and a second photosensing region including a second stack of one or more layers of transparent materials overlying the substrate, the second photosensing region having a spectral response having peaks and valleys; and wherein at least one peak or valley of the spectral response of the first region is matched to at least one valley or peak respectively of the spectral response of the second region such that the average spectral response of the photosensor is smoother than the individual spectral response of either the first or second photosensing regions.

8 Claims, 4 Drawing Sheets

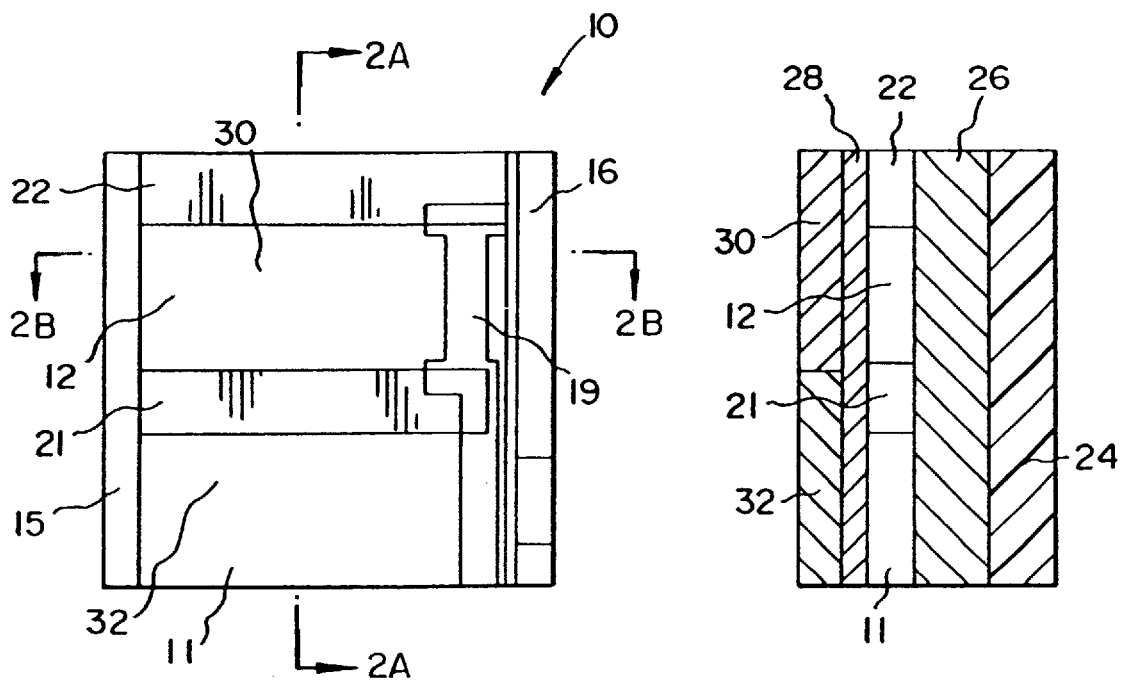
FIG. 1
(PRIOR ART)
FIG. 2A
(PRIOR ART)
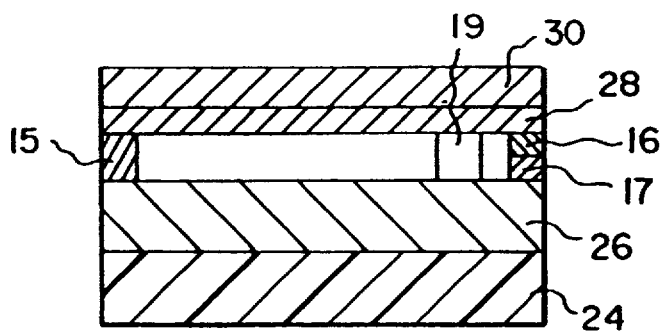
FIG. 2B
(PRIOR ART)

IMAGE SENSOR HAVING IMPROVED SPECTRAL RESPONSE UNIFORMITY

FIELD OF THE INVENTION

The invention relates generally to the field of image sensors, and more particularly to electrode structures used in MOS devices.

BACKGROUND OF THE INVENTION

U.S. Pat. No. 5,798,542 issued Aug. 25, 1998 to Anagnostopoulos et al. shows an image sensor having photosensors with first and second regions. Each region includes a stack of transparent layers, including a gate dielectric layer, transparent electrode layers, isolation layers and passivation layers over a semiconductor substrate. The spectral response of the photosensors is strongly affected by the layer materials and their relative thicknesses. As a result, the spectral response of the image sensor to incident light varies with wavelength, producing a spectral response curve with peaks and valleys. This problem can be particularly acute when the stack of transparent layers are identical for both regions.

There is a need therefore for an image sensor having improved spectral response uniformity.

SUMMARY OF THE INVENTION

The need is met according to the present invention by providing an image sensor, that includes a semiconductor substrate; a photosensor having, a first photosensing region including a first stack of one or more layers of transparent materials overlying the substrate, the first photosensing region having a spectral response having peaks and valleys, and a second photosensing region including a second stack of one or more layers of transparent materials overlying the substrate, the second photosensing region having a spectral response having peaks and valleys; and wherein at least one peak or valley of the spectral response of the first region is matched to at least one valley or peak respectively of the spectral response of the second region such that the average spectral response of the photosensor is smoother than the individual spectral response of either the first or second photosensing regions.

Advantages:

The image sensor has the advantage that the spectral response uniformity is improved. As a result, when color filters are added to the image sensor to produce a color image sensor, the uniformity of the color response of the sensor is greatly improved.

BRIEF DESCRIPTION OF THE DRAWINGS

FIG. 1 is a diagram of a prior art pixel architecture;

FIG. 2A is a cross section of FIG. 1 taken through the storage areas of the pixel of FIG. 1 as indicated by the line A—A;

FIG. 2B is a cross section of FIG. 1 taken through one of the phases of the pixel along the line B—B;

DETAILED DESCRIPTION OF THE INVENTION

Figure 3:
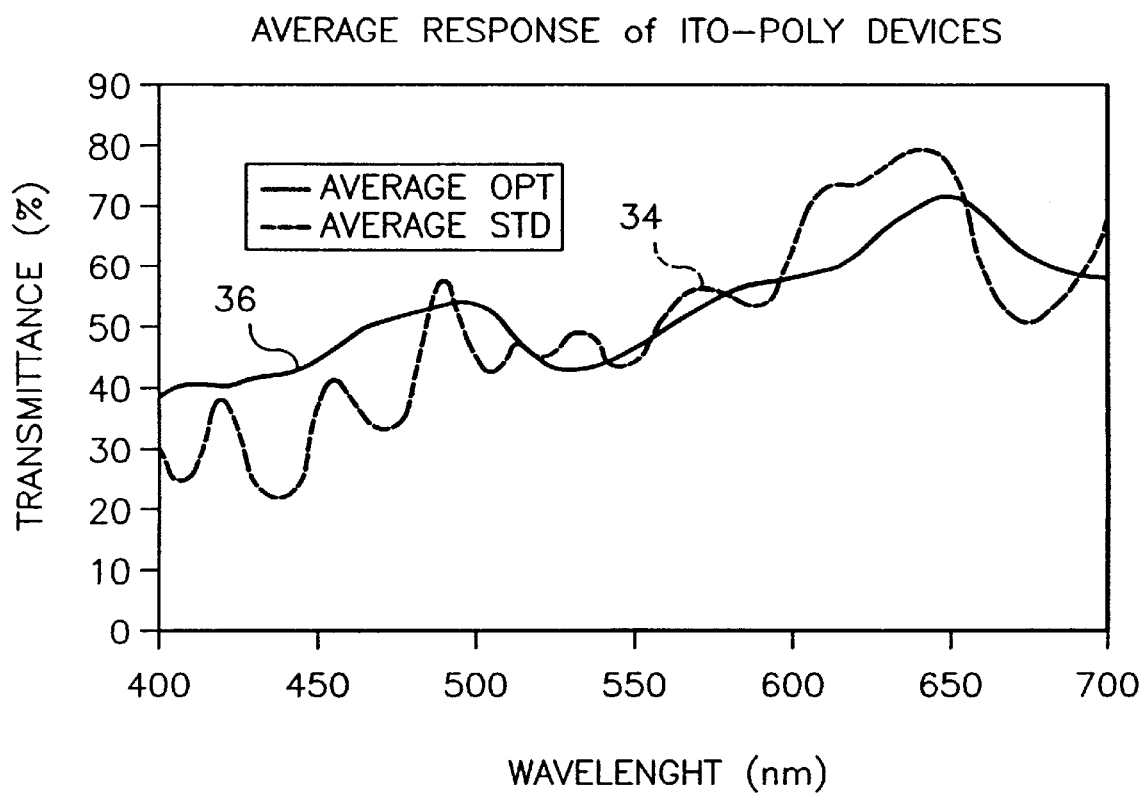
FIG. 3 shows the spectral response for a typical polysilicon-ITO CCD and a spectrally optimized polysilicon-ITO gate electrodes CCD according to the present invention.

Referring to FIG. 1, a prior art photosensor design useful with the present invention is shown. Photosensor 10 has first and second storage areas 11, 12 each having a respective barrier region 21, 22 to prevent stored charge from spilling out of the storage areas 11, 12. A lateral overflow drain 16 is provided for antiblooming protection. A first photosensitive region includes storage area 11, barrier region 21, and a first stack of layers including an overlying dielectric layer 28, polysilicon electrode 32, and possibly other layers such as isolation and passivation layers not shown. Similarly, a second photosensitive region includes storage area 12, barrier region 22, and a second stack of layers including overlying dielectric layer 28, polysilicon electrode 30, and possibly other layers such as isolation and passivation layers not shown.

Referring now to FIG. 2A, which is a cross sectional view of FIG. 1 along line A—A taken through the storage areas 11, 12 and the barrier regions 21, 22, illustrates the construction of photosensor 10 having substrate 24, that is preferably a highly doped p-type substrate, with an epitaxial layer 26 that is of a lesser doped p-type material formed thereon that extends to the surface. The storage regions 11 and 12 are preferably formed from a lightly doped n-type implantation into the epitaxial layer 26. The additional structures used to construct the photosensor 10 are also formed in epitaxial layer 26 such as barrier regions 21, 22 which are formed using the same n-type implant as in the storage region and an additional light p-type implant.

Referring to FIG. 2B, which is a cross sectional view of FIG. 1 along line B—B, the barrier region 19, which constitutes the overflow barrier to the drain to prevent blooming, is constructed exactly the same as barrier regions 21 and 22, but is drawn narrower to take advantage of the "short channel effect" and thus produces a slightly deeper surface channel potential. A channel stop 15 is formed preferably from a p+ implant. The lateral overflow drain 16 is formed using a high dose n-type implant within a p-type container implant 17. These structures formed upon epitaxial layer 26 have a potential that is controlled through an indium tin oxide electrode 30 and polysilicon electrodes 32 which are separated from these structures by silicon dioxide-silicon nitride-silicon dioxide (ONO) dielectric 28.

The spectral response of a full frame two phase CCD is strongly affected by the gate electrode materials and the relative thickness and the composition of dielectric films over the gate electrodes. The response of the CCD to the incident light varies with wavelength. CCDs are typically more responsive to red light than blue light. This optical response difference requires an electronic manipulation of the collected image to compensate for the difference in color response. Traditional full frame multi-gate CCDs may have all of the electrodes of equal thickness. The light paths and consequently, the absorption and reflectance of the film and their interfaces are very nearly equal. This results in a periodic rise and fall of the optical response of the imager over the wavelengths of interest. The rise and fall of the optical response is due to the absorption, reflection and constructive and destructive interference of the incident light. These interactions result in a constantly increasing and decreasing amount of light by wavelength entering the CCD wells throughout the visible spectrum. The rise and fall of the optical response changes as the wavelength changes because the optical interactions of the light changes with the CCD films as the wavelength of the incident light changes.

FIG. 3 shows a spectral response curve 34 for an image sensor of the type shown in FIGS. 1 and 2A–B. As can be seen, the response curve exhibits a number of peaks and valleys due to the multilayer interference of the layers over the storage areas 11, and 12.

The combination of films and their optical properties control the constructive and destructive inference effects of the incident light entering the CCD pixel. A two phase CCD has two electrodes above each pixel. The total amount of light entering each pixel is controlled by the films above. Through judicious choice of films and film thickness, the wavelength dependent combined transmission of each gate electrode pair can be made to change in a smooth and continuous manner over the entire spectrum from UV to the near IR.

According to the present invention, the thicknesses of the layers of one or both of the photosensitive regions is adjusted such that at least one peak or valley of the spectral response of the first region is matched to at least one valley or peak respectively of the spectral response of the second region such that the average spectral response of the photosensor is smoother than the individual spectral response of either the first or second photosensing regions. For example, the original thicknesses of electrode layers 30 and 32 were 175 nm of ITO and 170 nm of Polysilicon, respectively.

A computer simulation of the interference effects of the layers in the prior art device was run to generate a spectral response curve for each of the photosensitive regions. The thicknesses of the electrode layers were then adjusted and a new simulation was run to produce modified spectral response curves. The modified spectral response curves were examined to determine if one or more peaks of one of the curves fell in one or more valleys of the other curve, and the process repeated until a combined curve having more uniform spectral response was produced. The resulting spectral response, produced by electrode layers 30 and 32 having thicknesses of 95 nm of ITO and 170 nm of Polysilicon, respectively is shown as curve 36 in FIG. 3. Additionally, the thicknesses of overlying dielectric passivation layers (not shown in FIGS. 1 and 2A–B) were adjusted to further tailor the response of the sensor.

According to a preferred embodiment of the present invention, both of the electrode layers 30 and 32 are ITO and the individual thicknesses of the electrodes are controlled to optimize the uniformity of spectral response of the image sensor. Controlling each electrode's thickness allows the optical path of the incident light to be optimized so that the normal periodic change in transmission over wavelengths of interest of the film stack can be reduced or eliminated.

Figure 4:
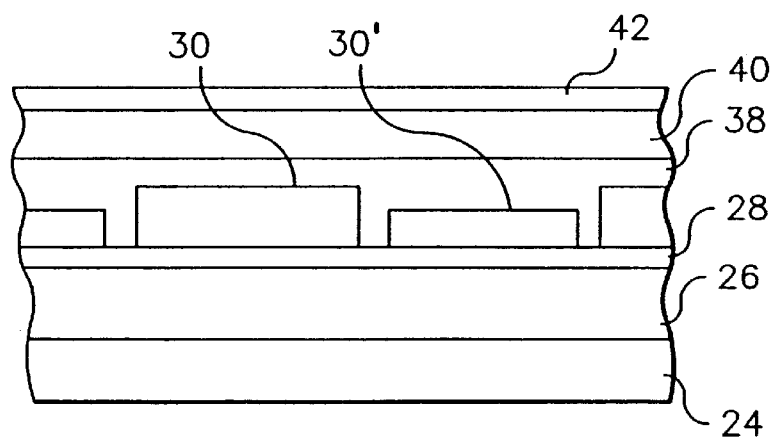
FIG. 4 shows the structure of a dual ITO gate electrode structure according to the present invention.

FIG. 4 illustrates the structure of a dual ITO gate electrode sensor having different electrode thicknesses used to create a spectrally smooth response according to the present invention. The sensor includes a substrate 24, an epitaxial layer 26, an ONO dielectric layer 28, and ITO gate electrodes 30 and 30' having different thicknesses. A silicon dioxide layer 38, a silicon oxynitride passivation layer 40, and a silicon dioxide antireflection layer 42 are provided over the electrodes. As shown, the thicknesses of the oxide layer over the ITO gate electrodes 30 and 30' may be different and will have an effect on the spectral response of the sensor. Each gate electrode and overlying oxide layers has an optical transmission that can be tailored such that the relative transmission of each gate electrode is the complement of the other for a particular wavelength. One gate electrode (e.g. 30) may have a high transmission for one wavelength while the other gate electrode (e.g. 30') has a much lower transmission. The end result is an average of the two electrodes transmission and a flatter response over a broad wavelength range.

Figure 5:
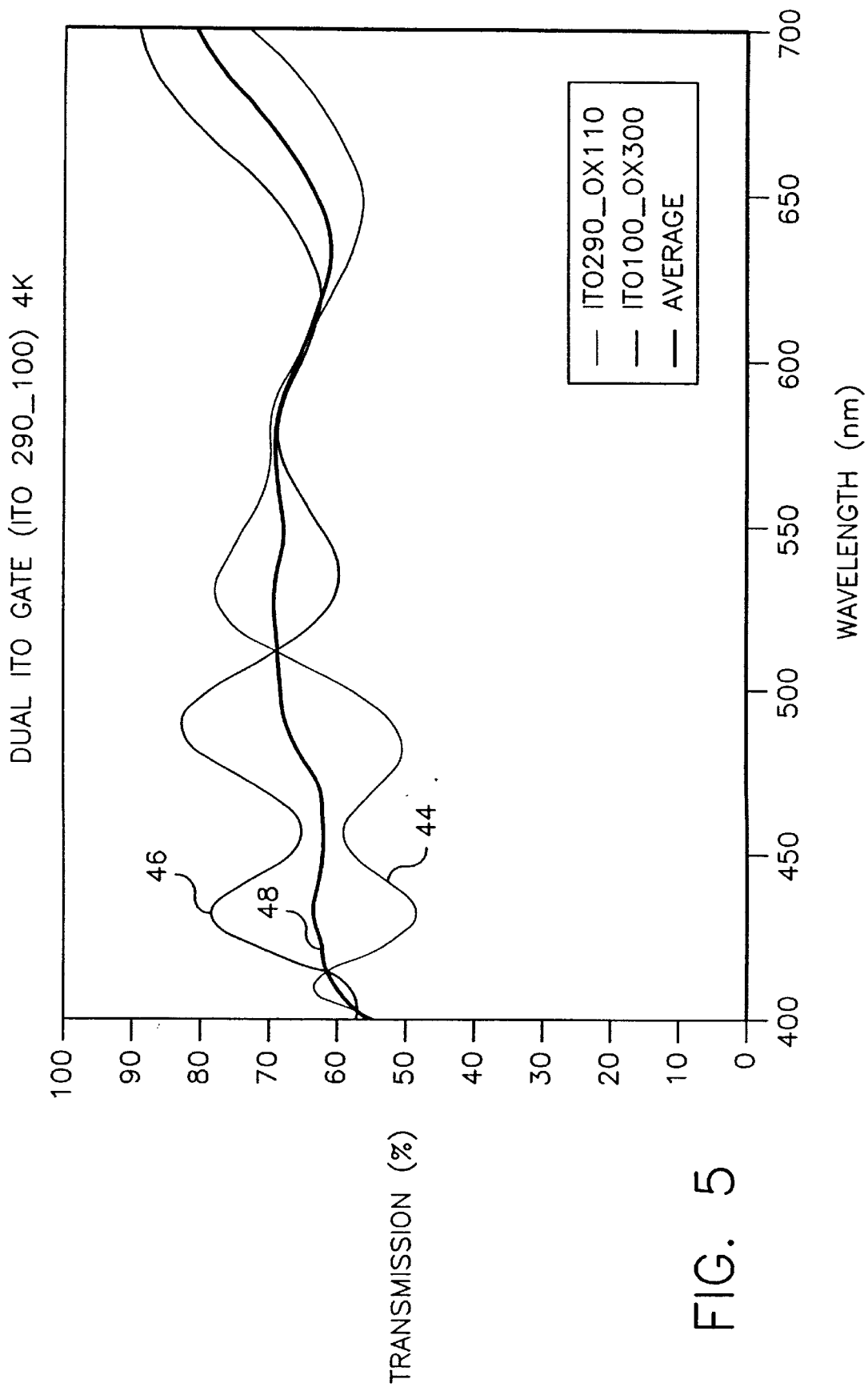
FIGS. 5, and 6 are spectral transmission curves for combinations of ITO gate electrodes with various final optical stacks. Each figure shows the individual gate transmission and the composite final transmission of the two electrodes.

Referring to FIG. 5 the spectral response of a first embodiment of the present invention is illustrated. The embodiment includes an electrode 30 having a thickness of 290 nm, electrode 30' having a thickness of 100 nm, a silicon dioxide layer 38 over electrode 30 having a thickness of 110 nm, and over electrode 30' of 300 nm, an oxynitride layer 40 having a thickness of 400 nm, and an antireflection layer 42 having a thickness of 100 nm.

The spectral responses of gate electrodes 30 and 30' are shown by curves 44 and 46 respectively. The average spectral response of the two gate electrodes is shown by curve 48. This arrangement results in a fairly flat and smoothly varying optical response.

Figure 6:
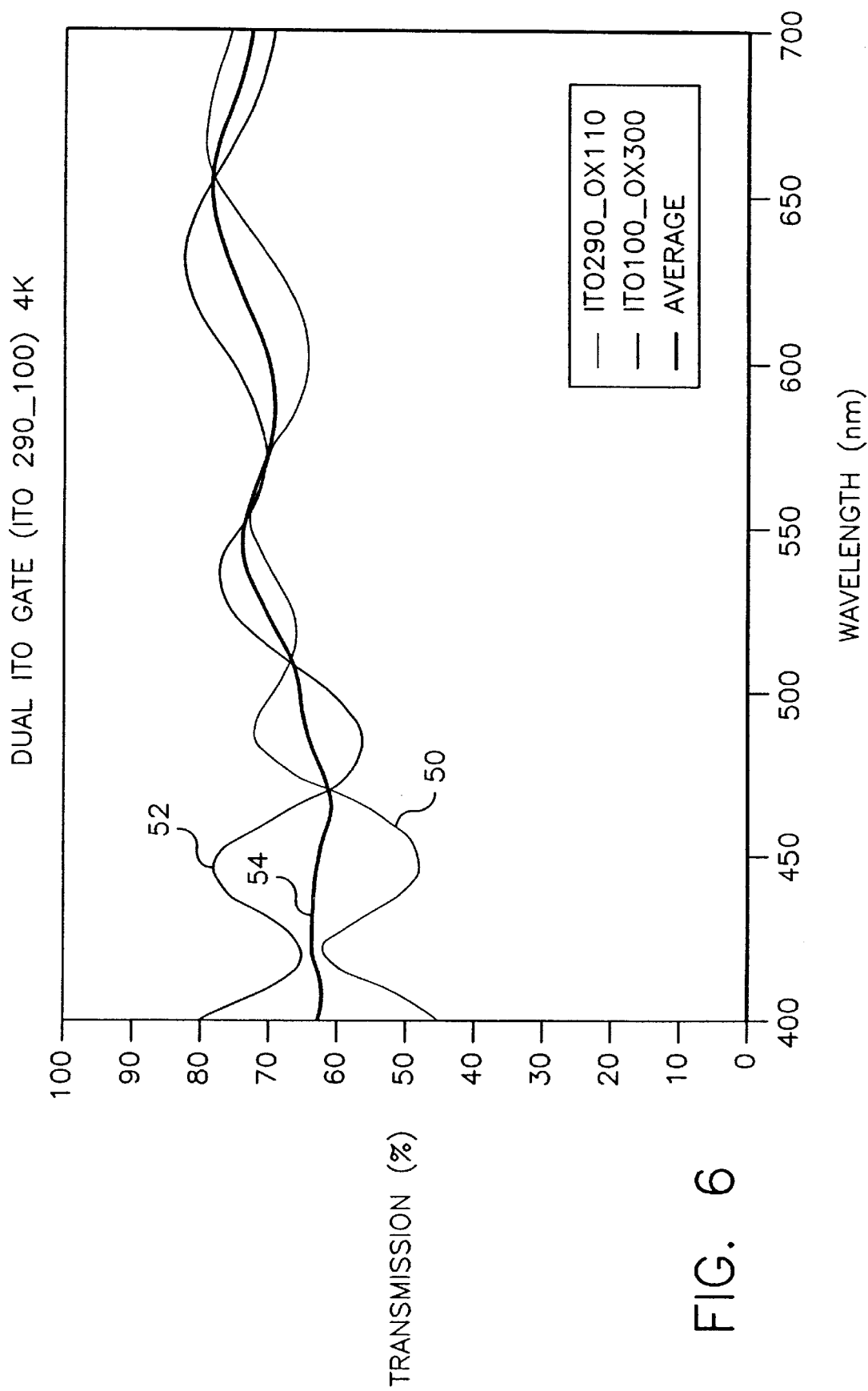

The average spectral response of the sensor can be further adjusted by tailoring the thicknesses of the overlying layers by making the silicon dioxide layer 38 over electrode 30 10 nm, and over electrode 30' 200 nm. As shown in FIG. 6, the resulting spectral responses of gate electrodes 30 and 30' are shown by curves 50 and 52 respectively. The average spectral response of the two gate electrodes is shown by curve 54.

The invention has been described in detail with particular reference to certain preferred embodiments thereof, but it will be understood that variations and modifications can be effected within the spirit and scope of the invention. For example although the invention has been described using two ITO gate electrodes, any other transparent conductive material used as gate electrode material can be tailored according to the present invention to provide a uniform spectral response. Furthermore, a sensor having more than two gates, e.g. four gates can be similarly tailored. Also, although the invention was described using different thicknesses for the gate electrode material, it will be understood that the gate electrode material may be of the same thickness and the thicknesses of the overlying layers may be tailored to achieve more uniform sensor response.

10 photosensor
11 first storage area
12 second storage area
15 channel stop
16 overflow drain
17 implant
18 barrier region
19 barrier region
21 barrier region
22 substrate
24 epitaxial layer
28 overlying dielectric layer
30 ITO gate electrode layer
30' ITO gate electrode layer
32 ITO polysilicon electrode layer
34 spectral response curve
36 spectral response curve
38 silicon dioxide layer
40 passivation layer
42 antireflection layer
44 spectral response curve
46 spectral response curve
48 spectral response curve
50 spectral response curve
52 spectral response curve
54 spectral response curve

What is claimed is:

1. An image sensor, comprising:
   a) a semiconductor substrate;
   b) a photo sensor having,
      i) a first photosensing region including a first stack of one or more layers of transparent materials overlying the substrate, the first photosensing region having a spectral response having peaks and valleys; and
      ii) a second photosensing region including a second stack of one or more layers of transparent materials overlying the substrate, the second photosensing region having a spectral response having peaks and valleys; and
   c) wherein at least one peak or valley of the spectral response of the first region is matched to at least one valley or peak respectively of the spectral response of the second region such that the average spectral response of the photosensor is smoother than the individual spectral response of either the first or second photosensing regions.

2. The image sensor claimed in claim 1, wherein number of layers and the materials in the first and second stack of layers are identical, and the thickness of one or more layers are different.

3. The image sensor claimed in claim 1, wherein the number of layers in the first and second stack and/or the materials are different.

4. The image sensor claimed in claim 1, wherein one of the layers in each stack is a gate electrode layer.

5. The image sensor claimed in claim 1, wherein one of the gate electrode layers is induim tin oxide.

6. The image sensor claimed in claim 1, wherein one of the gate electrode layers is polysilicon.

7. The image sensor claimed in claim 5, wherein the gate electrode layers in both stacks is indium tin oxide.

8. The image sensor claimed in claim 7, wherein the gate electrode layers in both stacks are of different thicknesses.

* * * * *